(12) United States Patent
Gao et al.

(10) Patent No.: US 10,330,746 B2
(45) Date of Patent: Jun. 25, 2019

(54) METHOD AND DEVICE FOR MEASURING A MAGNETIC FIELD

(71) Applicant: Halliburton Energy Services, Inc., Houston, TX (US)

(72) Inventors: Li Gao, Katy, TX (US); David L. Perkins, The Woodlands, TX (US); Michael T. Pelletier, Houston, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 75 days.

(21) Appl. No.: 14/435,722

(22) PCT Filed: Dec. 31, 2013

(86) PCT No.: PCT/US2013/078484
§ 371 (c)(1),
(2) Date: Apr. 14, 2015

(87) PCT Pub. No.: WO2015/102616
PCT Pub. Date: Jul. 9, 2015

(65) Prior Publication Data
US 2015/0268313 A1 Sep. 24, 2015

(51) Int. Cl.
*G01R 33/09* (2006.01)
*G01V 3/26* (2006.01)
(Continued)

(52) U.S. Cl.
CPC ........ *G01R 33/091* (2013.01); *E21B 47/0905* (2013.01); *G01R 33/063* (2013.01);
(Continued)

(58) Field of Classification Search
CPC .... G01R 33/063; G01R 33/09; G01R 33/091; G01R 33/093; G01R 33/18; G01V 3/26; G01V 3/40; G01L 1/12; G01L 1/125; H01L 41/12; H01L 41/125; H01L 41/20
USPC .................................................... 73/774, 779
See application file for complete search history.

(56) References Cited

U.S. PATENT DOCUMENTS 4,972,593 A * 11/1990 Dahlen ................. G01C 17/38
  33/356
4,992,776 A * 2/1991 Crossfield .......... G08B 13/2442
  310/118

(Continued)

FOREIGN PATENT DOCUMENTS

JP   2005338031 A * 12/2005 ............. G01R 33/02
WO   9915281      4/1999

OTHER PUBLICATIONS

International Search Report and Written Opinion of PCT Application No. PCT/US2013/078484 dated Sep. 24, 2014: pp. 1-16.

*Primary Examiner* — Benjamin R Schmitt
(74) *Attorney, Agent, or Firm* — Chamberlain Hrdlicka

(57) ABSTRACT

A system, method, and magnetic field sensor. The magnetic field sensor includes a strain gauge. The magnetic field sensor further includes one or more magnetostrictive layers disposed upon the strain gauge. The magnetostrictive layers are configured to cause a displacement of the strain gauge in response to sensing a magnetic field. The magnetic field sensor further includes logic connected to the strain gauge configured to determine a parameter of the magnetic field in response to sensing the magnetic field.

10 Claims, 5 Drawing Sheets

(51) Int. Cl.
  *G01V 3/40* (2006.01)
  *G01R 33/06* (2006.01)
  *G01R 33/18* (2006.01)
  *E21B 47/09* (2012.01)

(52) U.S. Cl.
  CPC .............. *G01R 33/18* (2013.01); *G01V 3/26* (2013.01); *G01V 3/40* (2013.01)

(56) References Cited

U.S. PATENT DOCUMENTS

| | | | |
|---|---|---|---|
| 5,103,174 A * | 4/1992 | Wandass | B82Y 35/00 324/209 |
| 5,585,775 A * | 12/1996 | Ishishita | G01R 33/09 324/207.21 |
| 5,675,252 A * | 10/1997 | Podney | G01R 33/02 324/209 |
| 6,230,799 B1 | 5/2001 | Slaughter et al. | |
| 6,304,082 B1 * | 10/2001 | Gualtieri | B82Y 25/00 324/247 |
| 6,931,940 B2 | 8/2005 | Baudendistel | |
| 7,675,253 B2 | 3/2010 | Dorel | |
| 8,316,964 B2 | 11/2012 | Hall et al. | |
| 2001/0028245 A1 | 10/2001 | Li et al. | |
| 2001/0040450 A1 | 11/2001 | Li et al. | |
| 2004/0126620 A1 * | 7/2004 | Viehland | H01L 41/00 360/328 |
| 2007/0247330 A1 | 10/2007 | Clark | |
| 2010/0108386 A1 | 5/2010 | Martinez et al. | |
| 2012/0098530 A1 | 4/2012 | Saito et al. | |

* cited by examiner

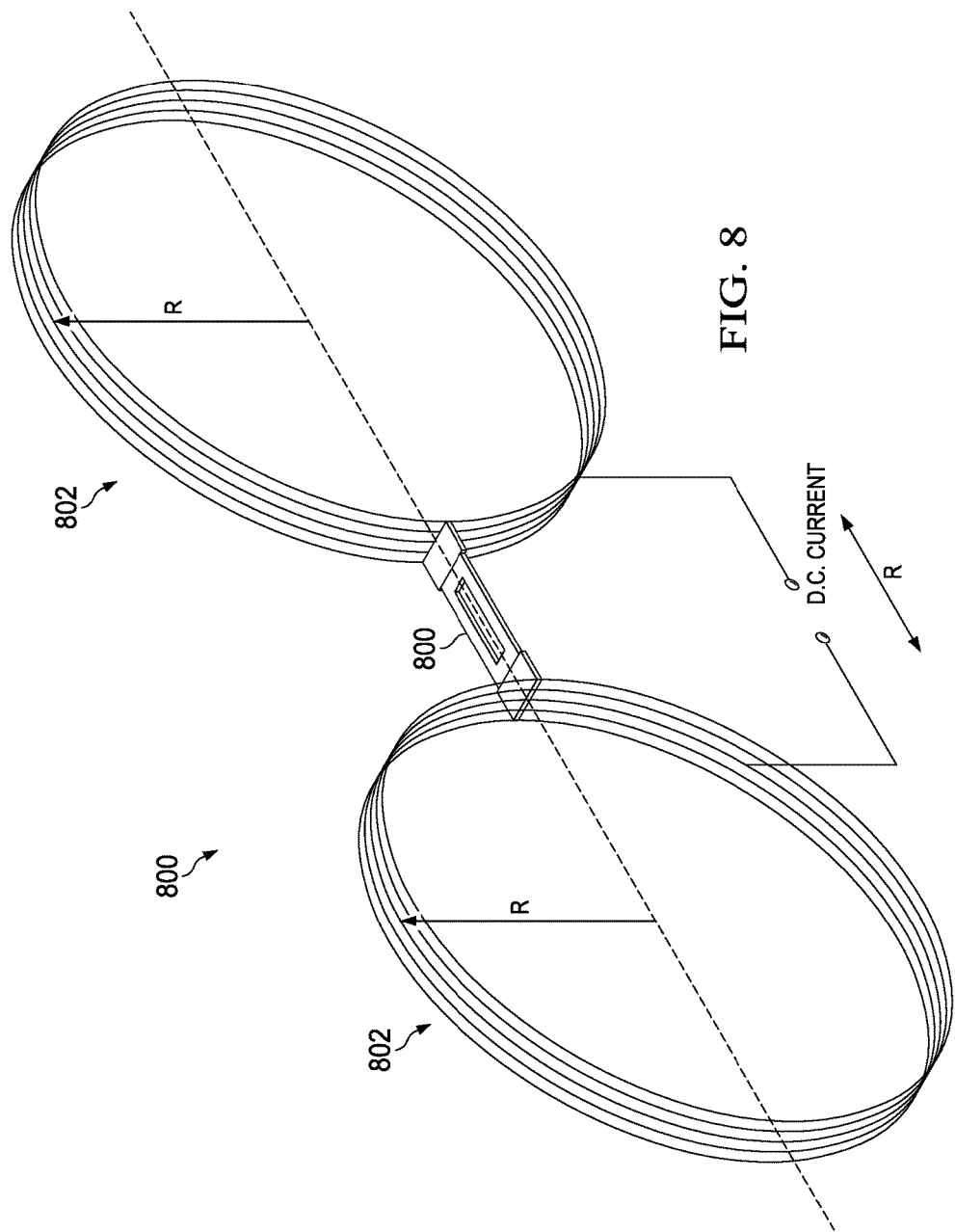

METHOD AND DEVICE FOR MEASURING A MAGNETIC FIELD

BACKGROUND

Sensory processes for determining proximity to magnetic fields or magnetic anomalies have improved significantly in recent years. For example, during natural resource exploration and development sensor measurements may be utilized to intercept various devices or components, determine capacity, make predictions, and implement exploration actions. In some cases, making measurements may require bulky sensor devices that are expensive and complicated.

BRIEF DESCRIPTION OF THE DRAWINGS

Illustrative embodiments of the present invention are described in detail below with reference to the attached drawing figures, which are incorporated by reference herein and wherein:

FIG. 8 is a schematic, representation of magnetic fields sensed by a magnetic sensor in accordance with an illustrative embodiment.

DETAILED DESCRIPTION OF THE DRAWINGS

The illustrative embodiments provide a system, method, device, and magnetic field sensor for detecting magnetic fields. In one embodiment, a sensor may be configured to determine a magnitude and orientation of local magnetic fields utilizing geomagnetism. The magnetic field may be utilized for well or component interception, formation analysis, logging, or any number of other measurement, detection, or analysis processes.

In one embodiment, a pressure or strain gauge may be coated with one or more layers of magnetostrictive materials. Magnetostrictive materials are materials that change shape or dimensions in the presence of a magnetic field. For example, the strain gauge may be a crystal pressure gauge and the magnetostrictive material may be Terfenol-D. However, the strain gauge may be layered, coated, or formed from any number of magnetostrictive materials, alloys, composites, or so forth. As a result, the materials coated, layered, or integrated with the gauge component may be configured to sense the changes in the magnetic field. As used herein, the term "or" does not require mutual exclusivity.

In one embodiment, the sensed magnetic field or corresponding changes may be converted into a frequency or signal detected by the gauge portion of the magnetic field sensor. The magnetic field sensor may include logic, circuitry, and so forth for converting the signal generated by the magnetic field sensor into an analog, digital, or visual output. In another embodiment, the detected signal may be communicated or output to one or more connected devices for processing and analysis.

Figure 1:
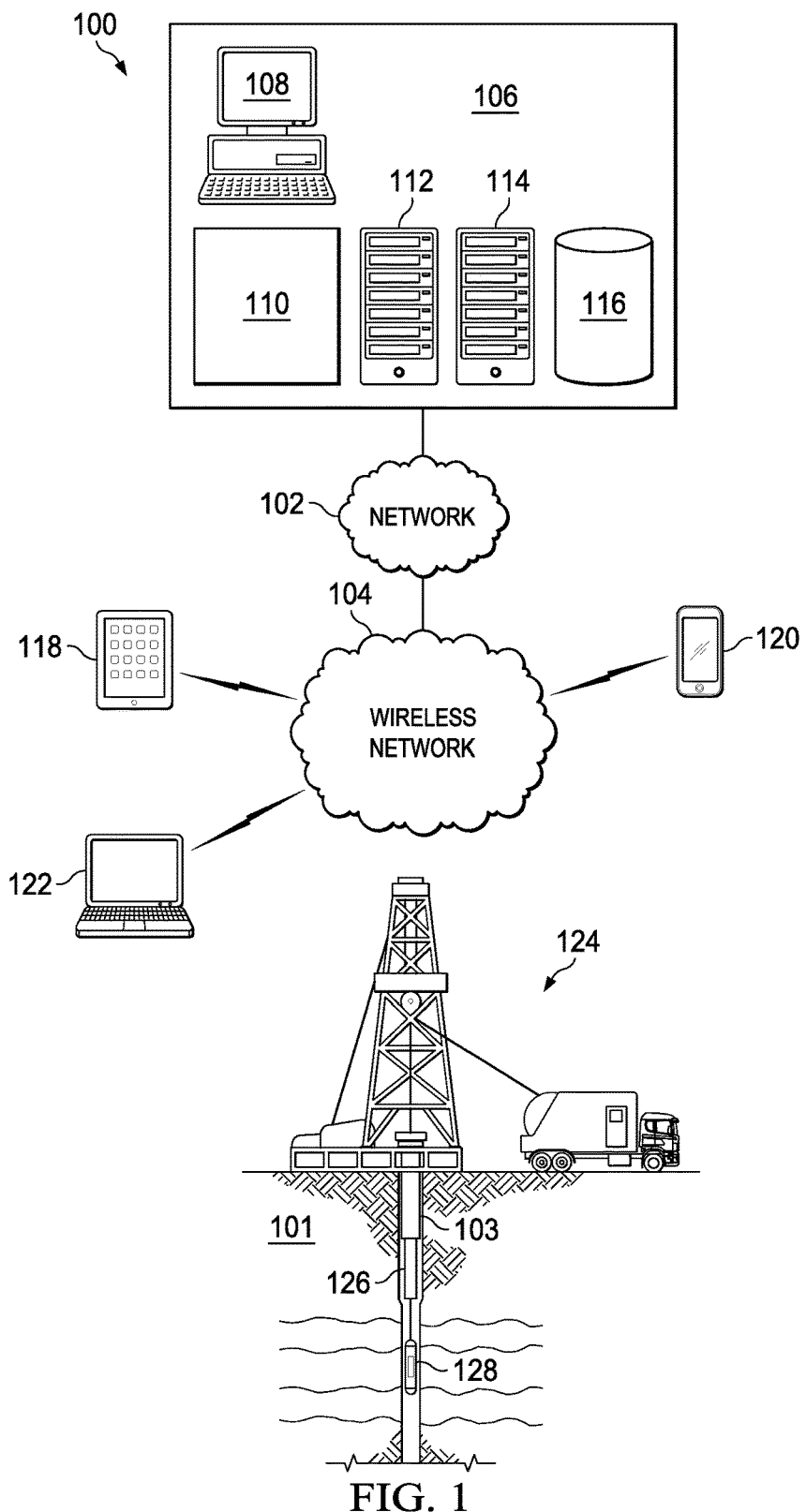
FIG. 1 is a schematic representation, with a portion shown in cross section, of a wireline logging environment in accordance with an illustrative embodiment.

FIG. 1 is a schematic, representation of a wireline logging environment 100 in accordance with an illustrative embodiment. The wireline logging environment 100 may include a number of tools, devices, locations, systems, and equipment that may be utilized to provide the sensor tools, systems, and methods herein described. The wireline logging environment 100 may also include a reservoir 101.

The reservoir 101 is a designated area, location, or three-dimensional space that may include natural resources, such as crude oil, natural gas, or other hydrocarbons. The illustrative embodiments may utilize sensors to determine the presence of magnetic fields in the reservoir 101. For example, the magnetic fields may be measured based on properties of the reservoir 101, structures or formations, deposits, downhole tools or components, or other materials that emanate, or perturb, a magnetic field. Processing or computations utilizing the signals retrieved by a magnetic field sensor may be performed downhole, on-site, off-site, at a movable location, at a headquarters, utilizing fixed computational devices, or utilizing wireless devices.

The reservoir may be penetrated by a wellbore 103. The reservoir 101 may include any number of formations, surface conditions, environments, structures, or compositions. In addition to exploration and natural resource retrieval, the wellbore 103 may be utilized to perform measurements, analysis, or production of the reservoir 101. The wellbore 103 may be drilled into the reservoir 101 to extract wellbore fluids or gases from the formation. The size, shape, direction, and depth of the wellbore 103 may vary based on the conditions and estimated natural resources available. The wellbore 103 may include any number of support structures or materials, divergent paths, surface equipment, or so forth.

In one embodiment, the processes herein described may be performed utilizing specialized sensor tools, including, without limitation, sensors, logic, circuits, interconnects, power sources, telemetry systems, and other similar electrical components. The logic of the sensor tools may include processors, memories, field programmable gate arrays (FPGAs), batteries, amplifiers, application specific integrated circuits, computer instructions, code, programs, or applications, or any combination of software, hardware, and firmware.

In one embodiment, the wireline logging environment 100 may include one or more of a network 102, a wireless network 104, a facility 106, a personal computer 108, a management system 110, servers 112 and 114, a database 116, a tablet 118, a wireless device 120, a laptop 122, and a mobile computing system 124. The mobile computing system 124 may include downhole equipment 126 and tool 128.

The network 102 may be any type of computing or communications network including one or more of the following networks: a wide area network, a local area network, one or more private networks, the Internet or public networks, a telephone network (e.g., publicly switched telephone network), a cable network, a satellite network, one or more cellular networks, cloud networks, virtual networks, and other wireless and data networks.

The wireless network 104 is one example of a wireless network for regional or local communications (e.g., WiFi, 4G, LTE, PCS, Bluetooth, Zigbee, WiMAX, GPRS, etc.). The network 102 and the wireless network 104 may include any number of network nodes, devices, systems, equipment, and components (not depicted), such as routers, servers, network access points/gateways, cards, lines, wires, switches, DNS servers, proxy servers, web servers, and other network nodes and devices for assisting in routing and computation of data/communications as herein described.

In one embodiment, integrated or external components of the mobile computing system 124 may be configured to penetrate an earth formation through the wellbore 103 to stimulate, energize, and measure parameters of a formation. One or more sensors or logging tools (e.g., probes, drill string measurement devices, nuclear magnetic resonance imagers, etc.) may be integrated with or connected to the download equipment 126 and tool 128 communicating with the mobile computing system 124 to perform measurements, logging, data retrieval, data storage, processing, and information display.

For example, the mobile computing system 124 may determine any number of static and dynamic properties of the reservoir 101. The static and dynamic properties may include measurements of or changes in pressure, depth, temperature, composition (e.g., hydrocarbon composition levels, measurements, and statistics), fluid flow rate, fluid composition, density, porosity, position and displacement, depth, and so forth. Changes or variations in the magnetic fields present within the reservoir 101 may be utilized to make any number of determinations regarding the natural formations, structures, or man-made components within the reservoir 101.

The tool 128 may represent any number of logging, wireline, slickline, measurement-while-drilling (MWD), seismic-while-drilling (SWD), logging-while-drilling (LWD) tools, or other downhole or reservoir tools. In one embodiment, the tool 128 may rotate sensors to enhance measurements made by the tool 128. The tool 128 may store or communicate the measured signals to determine magnetic fields in each section of the reservoir 101 or the wellbore 103. The tool 128 may be self-contained and powered or connected to one or more fixed or mobile stations, systems, devices, equipment, or vehicles at the surface.

For example, although not shown in FIG. 1, the wireline logging environment 100 may alternatively be replaced by a drilling configuration including one or more of a derrick, a hoist, pumps, hoses, connectors, a drill string, drilling motors (e.g. top drive, downhole motor, etc.) and other similar components (not shown). In one embodiment, the tool 128, systems, and components described in the illustrative embodiments may be implemented in a bottomhole assembly (i.e., the lowermost party of the drill string) or other portion of the drill string or exploration system and components. As a result, the tool 128 may be utilized while drilling to detect magnetic fields.

In one embodiment, the tool 128 or other portions of the mobile computing system 124 may communicate one or more signals or waves to excite magnetic fields within the reservoir 101. The wave or signal utilized by the tool 128 to perform measurements may be generated by the tool 128 or received from any number of sources. In one embodiment, the waves may be generated by an electromagnetic pulse generator or continuous wave electromagnetic source.

The personal computer 108, tablet 118, wireless device 120, laptop 122, and mobile computing system 124 may execute a local program or app to configure the tool 128 and retrieve and utilize the measurements acquired in the process herein described. For example, the wireless device 120 may be configured to increase or decrease a bias or offset field utilized by the tool 128. The wireless device 120 may also be utilized to filter particular types of signals, turn the tool (in any of three dimensions), or so forth.

In another embodiment, the tool computations and analysis may be performed by the management system 110, servers 112 and 114, or other network devices. For example, the user may submit information and parameters utilizing the wireless device 120 to perform the calculations on the server 112 with the results being stored in the database 116 for subsequent access. The database 116 may store the sensor orientation information, measurements, static properties, dynamic properties, flow simulation results (e.g., initial values, partial output, and completed output), parameters, configuration, settings, and so forth. The database 116 may be accessed by any number of users and devices in the wireline logging environment 100 to retrieve and update the data.

Figure 2:
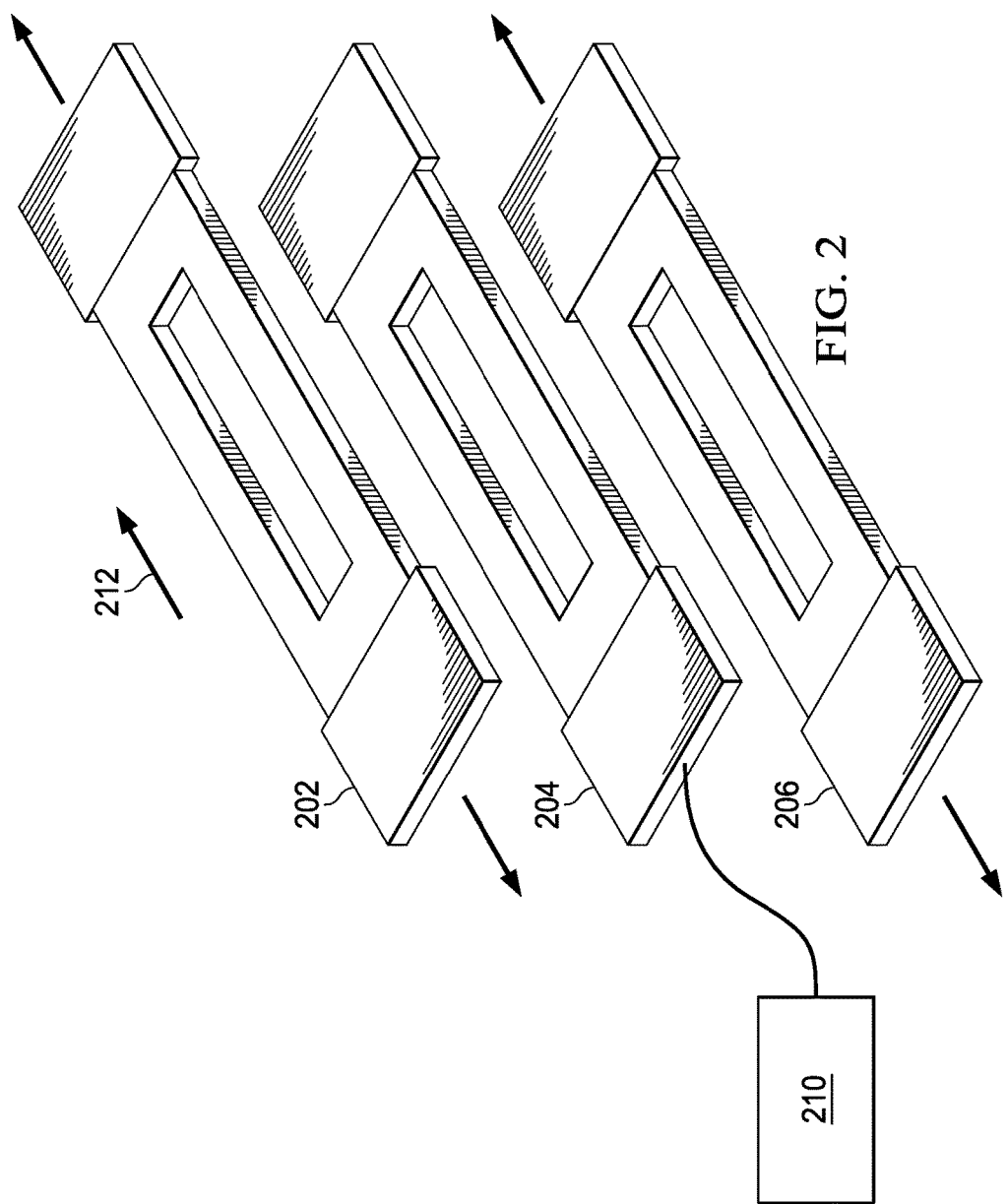
FIG. 2 is a schematic, exploded view of a magnetic field sensor in accordance with an illustrative embodiment.
Figure 3:
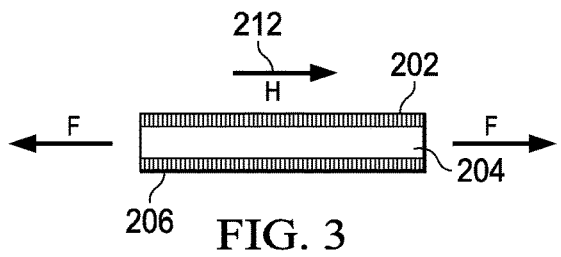
FIG. 3 is a schematic, exploded view of a magnetic field sensor in accordance with an illustrative embodiment.

Turning now to FIGS. 2-3 illustrative a magnetic field sensor 200 in accordance with an illustrative embodiment. The magnetic field sensor 200 may utilize any number of configurations or embodiments. In one embodiment, the magnetic field sensor 200 may include multiple layers 202, 204, and 206. In one embodiment, the layer 204 represents a quartz crystal gauge or beam with fixed ends coated with a magnetostrictive material 208 shown by layers 202 and 206.

In other embodiments, the layer may include or define a vibrating rod or wire positioned between fixed ends coated with the magnetostrictive materials. In addition, to having fixed ends, the layer 204 may be cantilevered where one end of the vibrating component is free or unfixed.

For example, the quartz crystal gauge may represent a singular component and configuration or may define multiple components, such as a beam, isolator mass, isolator spring, anchors or based components, or so forth. In one embodiment, the magnetostrictive material is Terfenol-D. In other embodiments, the magnetostrictive material may also be Cobalt, Metglas, Galfenol, rare earth-iron film, or so forth.

The magnetic field acts as a force that affects the magnetostrictive layers 202 and 206. The strain that results from magnetostriction results in tension on layer 204. The magnetic field sensor 200 may be connected to logic 210 that may utilize the properties of the magnetic field sensor 200 to determine a magnetic field 212 affecting the layers 202 and 206 and thereby layer 204. For example, a sensed magnetic field may affect the magnetostrictive material 208 of layers 202 and 206 to deform layer 204 thereby resulting in property changes to the layer 204. The properties may represent frequency, resistance, conductance, or so forth. The sensed changes in the properties may output as a signal to the logic 210.

In one embodiment, logic 210 may be configured to receive a signal from the layer 204 and process the signal to determine information and data regarding a magnetic field detected by the magnetic field sensor 200. For example, the logic 210 may include an analog-to-digital converter and processor or ASIC for processing the signals received according to one or more algorithms, set or instructions or programming code, or processes that are herein described or known in the art. The various components of the magnetic field sensor 200 may be connected or communicate via pins, wires, traces, leads, fiber optics, or other communications or conductive components.

For example, the layer 204 may represent a quartz pressure gauge with a vibration portion (e.g., beam). The force resulting from the magnetic field affects the resonance frequency of the quartz pressure gauge. The resulting frequency change may be utilized to determine a magnitude and orientation of the sensed magnetic field.

In one embodiment, the material properties for the layers 202-206 are as follows:

Layer 204 (e.g., Quartz gauge):
a. Elastic modulus $E_Q$=79 GPa, density $\rho_Q$=2650 kg/m$^3$
Layers 202 and 206 (e.g., Terfenol-D):
a. Elastic modulus $E_T$=35 GPa, density: $\rho_T$=9250 kg/m$^3$ In one embodiment, the deformation of the layer 204 (e.g., a composite beam) may be analyzed utilizing the parallel axis theorem, the area moment of inertia (I) for the composite beam in the xx direction may calculated to be:

$$I = \frac{n_Q}{12} t_Q^3 w + \frac{1}{6} t_T^3 w + \frac{1}{2} t_T w (t_Q + t_T)^2 \quad \text{(Equation 1)}$$

where w is the width of the composite beam 204, $t_Q$ the thickness of the layer 204 (e.g., quartz crystal layer), $t_T$ the thickness of the layers 202 and 206 (e.g., Terfenol-D). The scaling factor $n_Q$ is defined as $$n_Q = \frac{E_Q}{E_T}.$$

The linear density (m) of the composite beam of the layer 204 may be given by:

$$m = 2\rho_T \cdot w \cdot t_T + \rho_Q \cdot w \cdot t_Q = w(2\rho_T t_T + \rho_Q t_Q) \quad \text{(Equation 2)}$$

When the magnetostrictive layers 202 and 206 are subject to the magnetic field 212, it produces strain as result of magnetostriction, resulting in tension in the layer 204. Assuming this tension is T, then the motion of the layer 204 may be described by the following differential equation with the given boundary conditions:

$$EI \frac{\partial^4 y(x,t)}{\partial x^4} - T \frac{\partial^2 y(x,t)}{\partial x^2} + m \frac{\partial^2 y(x,t)}{\partial t^2} = 0, \quad \text{(Equation 3)}$$

$$y(0,t) = y(l,t) = 0, \left.\frac{\partial y(x,t)}{\partial x}\right|_{x=0} = \left.\frac{\partial y(x,t)}{\partial x}\right|_{x=l} = 0.$$

This assumes the two ends of the layer 204 are fixed. Equation 3 may be solved via Laplace Transform method or other means to show that at resonance, the frequency of layer 204 obeys the following frequency equation:

$$G(\Omega) = (U \sinh(M_1)\sin(M_2) + \Omega \cosh(M_1)\cos(M_2) - \Omega = 0 \quad \text{(Equation 4)}$$

$$\Omega = \omega \sqrt{\frac{m}{EI}} = 2\pi f \sqrt{\frac{m}{EI}}$$

where $$U = \frac{T}{2EI}$$

$$M_1 = l\sqrt{U + \sqrt{U^2 + \Omega^2}}$$

$$M_2 = l\sqrt{-U + \sqrt{U^2 + \Omega^2}}$$

Every parameter in the frequency Equation 4 is a known physical parameter of the layer 204 except the tension T due to magnetostriction. Once T is obtained, the magnetic sensor 200 or interconnected device or logic 210 may directly calculate the effect of magnetic field 212 on the resonance frequency to determine the magnitude and direction of the magnetic field 212.

Figure 4:
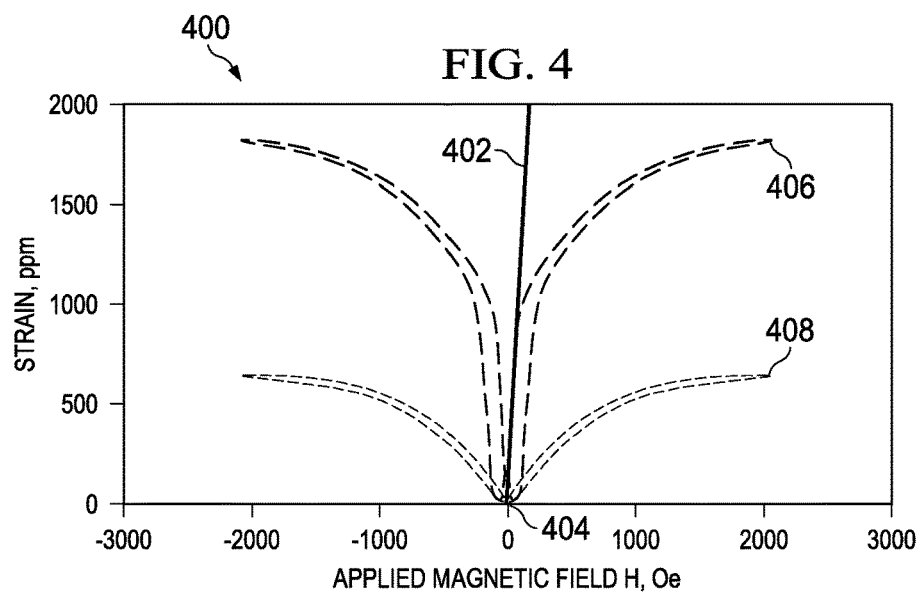
FIG. 4 is a graphical representation of a butterfly curve for a magnetostrictive material in accordance with an illustrative embodiment.

In order to calculate the amount of strain generated by the layers 202 and 206 in the presence of the magnetic field 212, the relationship between strain the applied magnetic field may need to be determined. In one embodiment, this is done utilizing the "butterfly curve" associated with the magnetostrictive material as shown in FIG. 4. The butterfly curve may be a transcendental plane curved. Line 402 near the origin 404 is provided as a guide. The slope of the line 402 is given by:

$$\frac{\Delta \varepsilon}{\Delta H} \approx 13.5 \ ppm/Oe = 13.5 \ \mu\varepsilon/Oe \quad \text{(Equation 5)}$$

Graph 400 illustrates a curve 406 for a magnetostrictive material, such as Terfenol-D, with a 6.9 MP preload and a curve 408 illustrating no preload. In one embodiment, the slop of the line 402 is determined by measuring the change in the magnetic field and the corresponding change in strain. For example, with a 6.9 MP preload a 1 OE magnetic field may generate 13.5 microstrains in the magnetostrictive material or layers. Using the relationship between strain ($\varepsilon$), stress ($\sigma$), and elastic modulus (E):

$$E = \frac{\Delta \varepsilon}{\Delta \sigma}, \quad \text{(Equation 6)}$$

The magnetostrictive stress ($\Delta \sigma$) may be calculated by:

$$\Delta \sigma = E_T \cdot \Delta \varepsilon = 13.5 \times 10^{-6} \times 35 \text{GPa/Oe} = 472500 \text{Pa/Oe} \quad \text{(Equation 7)}$$

Figure 5:
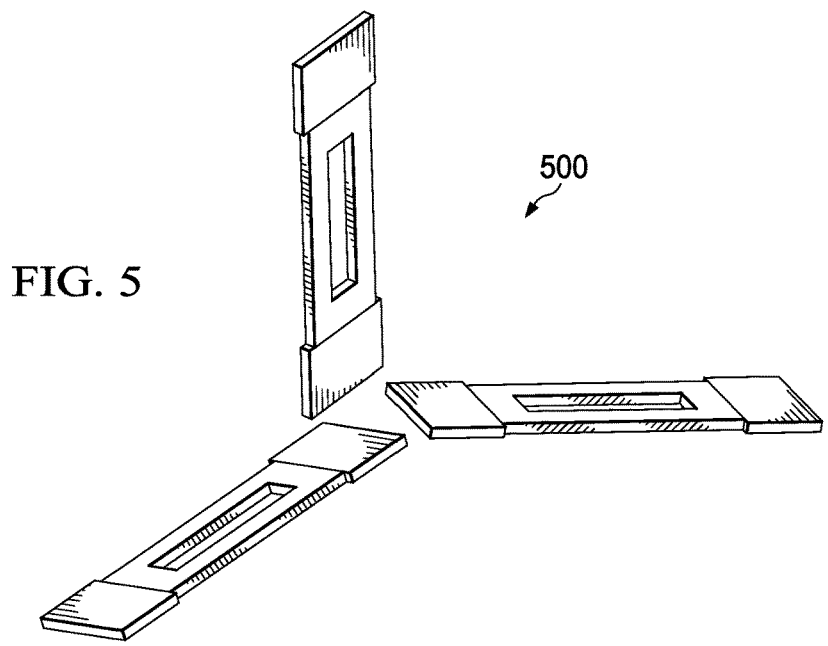
FIG. 5 is a schematic, representation of a magnetic field sensor array in accordance with an illustrative embodiment.

The total force due to magnetostriction may then given by $T = 2t_T \times w \times \Delta \sigma$ In one embodiment, the resonance frequency may be determined using the frequency equation (Equation 4). The frequency equation may be plotted out with the only unknown in the expression $\Omega$ as a variable. Rewriting $G(\Omega)$ into $G(z) = G(l^2\Omega)$, this expression may be plotted out as shown in FIG. 5. The first root $G(z_0) = G(l^2\Omega_0) = 0$ gives the fundamental resonance frequency $f_0$ according to Equation 4:

$$f_0 = \frac{z_0}{2\pi l^2} \sqrt{\frac{EI}{m}} \quad \text{(Equation 9)}$$

A simple root-finding algorithm, such as Newton's algorithm may be used to iteratively find the root $G(z_0) = 0$, starting with a guess value for $z_o$. The change in the frequency may be utilized to determine the detected magnetic field. In one embodiment, the various sensors or detectors may be calibrated during manufacturing, in a laboratory, or in an environment.

Turning again to FIGS. 2-3, a composite beam of the layer 204 may be placed in a magnetic field parallel to a long axis of the layer 204. Tension is generated by the layers 202 and 206. The tension results in a slight shift of the root $z_o$. For illustrative purposes, the following physical parameters for the layer 204 are used:

Physical dimensions: $t_Q$=0.5 mm, $t_T$=0.25 mm, w=2 mm, l=10 mm.

6.9 MPa Preload: $T_0$=−6.9×10$^6$ Pa×(2×$t_T$×w+$t_q$×w)=−13.8 Newton

Tension due to 1 Oe: $\Delta T = 2 \times t_T \times w \times \Delta \sigma = 472500 \times 2 \times t_T \times w = 0.4725$ Newton With these sample parameters, the fundamental frequencies of the composite beam of layer 204 with and without 1 Oe magnetic field are:

|  | Tension in the Composite beam (Newtons) | Fundamental resonance frequency (Hz) |
|---|---|---|
| 6.9 MPa preload only | −13.8 | 26648.43 |
| 6.9 MPa preload + 1 Oe field | −13.32 | 26654.26 |
|  |  | Δf = 5.83 Hz |

A 5 Hz shift in frequency out of 26 kHz may be a small change. However, determining frequency measurement to high precision may be performed utilizing logic. In another embodiment, multiple composite beam or strain gauge sensors may be connected together. One of the sensors may include magnetostrictive layers or materials and one may not. Thus, a low frequency signal may be generated in the presence of magnetic field 212, while such a frequency signal is absent in the sensor without magnetostrictive materials absence of magnetic field. The magnetic field sensor outputs a frequency signal that may be proportional to the magnetic field strength.

In another embodiment, multiple layers of quartz crystal gauges and magnetostrictive materials may be interlaced, stacked, or layered to achieve amplification of the forces resulting from the magnetic fields. As a result, the resulting forces upon the interlayered strain gauges and magnetostrictive materials may be maximized for an optimized reading of the magnetic field.

Figure 6:
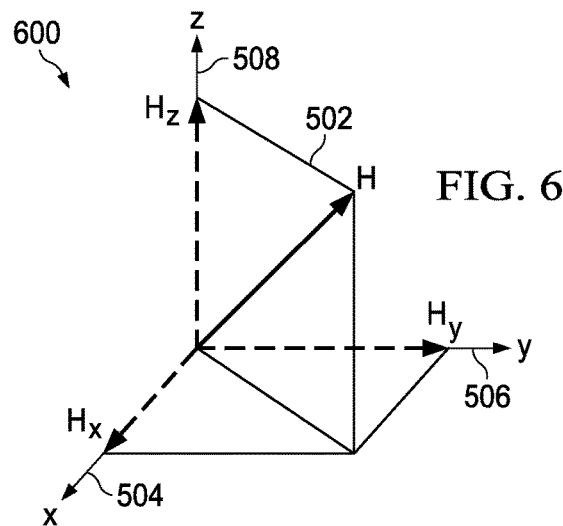
FIG. 6 is a schematic, representation of vectors associated with the magnetic field sensor array of FIG. 5 in accordance with an illustrative embodiment.
Figure 7:
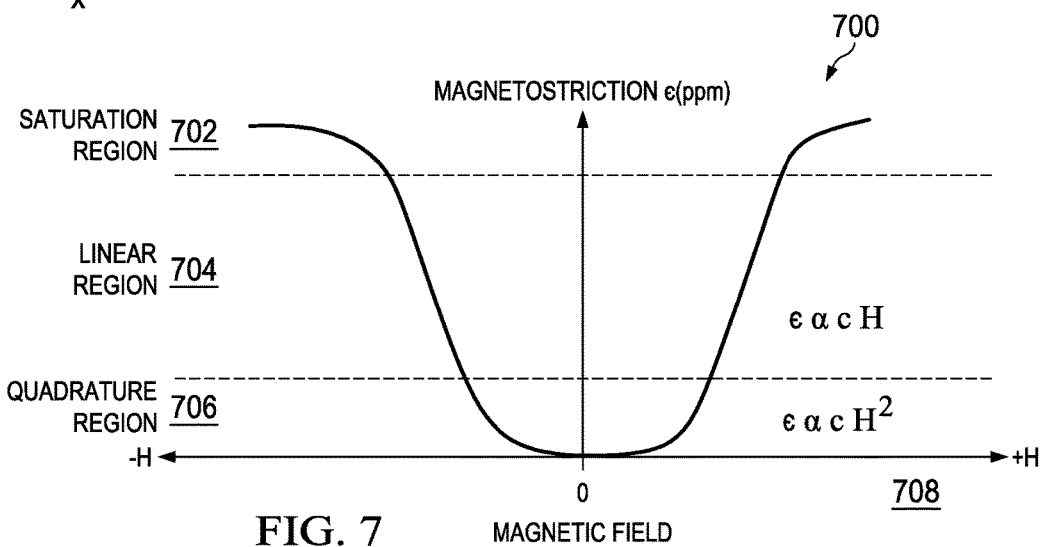
FIG. 7 is a graphical representation of magnetostriction in accordance with an illustrative embodiment.

Turning now to FIGS. 5 and 6 showing a schematic, representation of a magnetic field sensor array 500 and a graph 600 representing vectors associated with the magnetic sensor array 500. In one embodiment, the magnetic field sensor array 500 may include multiple magnetic field sensors. For example, the magnetic field sensor array 500 may include a set of three orthogonal sensors. A magnetic field H 502 that is oriented in any arbitrary direction may be decomposed into the three orthogonal orientations, $H_x$ 504, $H_y$ 506, and $H_z$ 508, (as shown by the graph 600) along the three orthogonal sensor directions. As a result, the magnetic field may be measured more definitely and decomposed into distinct components along an x, y, and z axis of a sensor tool. Specific actions, such as steering a tool or performing avoidance, Turning now to FIGS. 7 and 8 showing a magnetostriction graph 700 and a magnetic field sensor 802 in a magnetic field 708. In one embodiment, the sensitivity of magnetostrictive materials utilized in the magnetic field sensor 804 may be enhanced with a bias field. Graph 700 illustrates a typical response of a magnetostrictive material, such as Terfenol-D in the magnetic field 804. The graph 700 illustrates a saturation region 702, a linear region 704, and a quadrature region 706.

Of the three regions, it may be desirable to operate the magnetic field sensor 702 in the linear region 704 where the magnetostrictive material has the largest change in magnetostriction with the changing magnetic field 708. In one embodiment, a pair of Helmholtz coils 802 may be utilized to generate a uniform magnetic field along the axis of the magnetic field sensor 802. The d.c. current fed into the Helmholtz coils 802 may be tuned to desired value so as to achieve the highest sensitivity in the magnetostrictive material. For example, the Helmholtz coils 802 may be integrated in a downhole or logging tool that utilizes the magnetic field sensor 802. In another embodiment, permanent magnets may be arranged to achieve the proper tuning.

Figure 9:
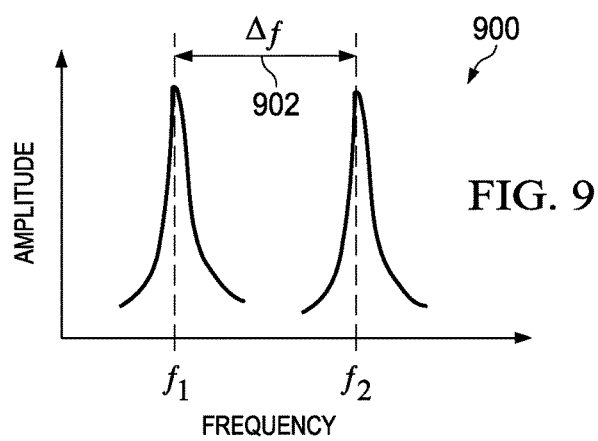
FIG. 9 is a graphical representation of a response by a magnetic field sensor to a magnetic field.

Turning now to FIG. 9, showing a graph 900 illustrating a response of a magnetic field sensor to a magnetic field in accordance with an illustrative embodiment. When temperature and pressure are known, the resonance frequency of a quartz crystal of the magnetic field sensor shifts as a function of applied strain. Based on the results in a section 1 902 the response may be described as:

$$\Delta f = F(\varepsilon) \quad \text{(Equation 10)}$$

In the presence of a magnetic field H, in the linear region (after bias), the strain due to the magnetostrictive layers is:

$$\varepsilon = c \cdot H \quad \text{(Equation 11)}$$

Where c is a constant, H is the strength of the magnetic field component along the long-axis of the quartz crystal. As a result, the measurement of frequency shift yields the strain on the quartz crystal of the magnetic field sensor, which leads to the magnetic field.

In one embodiment, prior to field application, a quartz crystal-Terfenol-D multilayer sensor may be calibrated with known magnetic field which yields the resonance peak at $f_1$ as depicted in FIG. 9. Such a magnetic field may be the expected average geomagnetic field at the field location or measurement environment. In one embodiment, as the magnetic field sensor is placed on a tool or bottomhole assembly inside a well and as the orientation and magnitude of the local geomagnetic field changes, the resonance frequencies of three orthogonal sensors may shift accordingly. By analyzing the shift in resonance frequency Δf, a determination of true magnetic North may be made.

In another embodiment, the difference of resonance frequencies among the three orthogonal sensors may be monitored. When one of the sensors has the maximum frequency shift while the other two sensor experiences minimal shift, then the sensor with the maximal shift is then substantially aligned with the local magnetic field direction.

In yet another embodiment, the three orthogonal sensors may be coupled into pairs or groups. The output of each pair will be the beat frequency as result of the difference of the two sensors. At much lower frequency, the beat frequency is easier to measure. The beat frequency may also be utilized to enhance the resolution in magnetic field measurements.

In addition to applications as geomagnetic positioning device, the magnetic field sensor herein described may also be utilized to detect any local magnetic anomalies, such as buried pipe, casing, etc. Magnetic field sensing may be utilized and extremely important for well interception. The magnetic field sensor may also be used to detect the presence of magnetic ores.

The magnetic field sensors herein described may require quartz resonant transducers. In one embodiment, a set of uncoated reference oscillators may be required to get the highest precision out of the sensor system. For example, a reference sensor may allow for compensation based on some of the more difficult to match shifts or offsets driven by temperature, pressure, and aging of the underlying quartz oscillating crystals. The magnetic field sensors may compensate for some of the deviations utilizing modeling, but increased accuracy is most often achieved in referenced systems.

In one embodiment, the magnetostrictive material may be applied utilizing chemical vapor deposition, thin film deposition, sputtering, atomic layer deposition, or other deposition processes. In another embodiment, the magnetostrictive material may be integrated with the material utilized to form the quartz crystal gauge. Nano laminating may also be utilized followed by ion homogenization.

One embodiment provides a system, method, and magnetic field sensor. The magnetic field sensor may include a strain gauge. The magnetic field sensor may further include one or more magnetostrictive layers disposed upon the strain gauge. The magnetostrictive layers may be configured to cause a displacement of the strain gauge in response to sensing a magnetic field. The magnetic field sensor may further include logic connected to the strain gauge configured to determine parameters of the magnetic field in response to sensing the magnetic field.

In another embodiment, the magnetic field sensor may include a memory configured to store readings from the strain gauge. The strain gauge may be a quartz crystal strain gauge. The parameters may include any or all of an amplitude, orientation, or change of the magnetic field. The magnetostrictive layers may be formed from Terfenol-D. The magnetic field sensor may further include one or more arrays of strain gauges including the strain gauge. Each of the one or more arrays of strain gauges may include at least three orthogonal he position strain gauges to sense the amplitude and orientation of the magnetic field. In amplitude and orientation of one or more magnetic fields including the magnetic field may be communicated to a remote device. The strain gauge may include a number of gauge layers interlayered with the one or more layers of magnetostrictive layers. The magnetic field sensor may be integrated in a downhole tool for natural resource exploration.

Another embodiment provides a magnetic field sensor. The magnetic field sensor may include an array of court strain gauges. The magnetic field sensor may further include one or more magnetostrictive layers disposed upon the array of court strain gauges. The magnetostrictive layers deform the array of court strain gauges in response to sensing and magnetic field. The magnetic field sensor may further include logic connected to the array of court strain gauges that determines parameters of the magnetic field in response to the magnetostrictive layers sensing the magnetic field.

In another embodiment, the array of court strain gauges may include at least three orthogonally placed quartz strain gauges. The array of court strain gauges may generate signals that represent resonance frequencies of each of the quartz strain gauges that are utilized to determine the parameters including at least an amplitude and an orientation of the magnetic field. The array of quartz strain gauges may include at least two sets of three orthogonally play positioned quartz strain gauges. The one or more magnetostrictive layers may be interlayered with each of the array of quartz strain gauges.

Yet another embodiment includes a method for measuring a magnetic field. A downhole tool including a magnetic field sensor may be positioned in a wellbore. A signal may be generated utilizing a gauge including one or more layers of magnetostrictive materials in response to sensing the magnetic field. The signal is processed to determine parameters of the magnetic field.

In another embodiment, the magnetic field sensor may include a quartz strain gauge coated in the one or more layers of the magnetostrictive materials. The parameters may include an amplitude and an orientation of the magnetic field. The deformation of the quartz strain gauge is determined utilizing the parallel axis theorem. The signal represents a resonance frequency of a strain gauge of the magnetic field sensor. The magnetic field sensor is utilized to determine proximity to a wellbore component.

In the previous embodiments, reference is made to the accompanying drawings that form a part hereof. These embodiments are described in sufficient detail to enable those skilled in the art to practice the invention, and it is understood that other embodiments may be utilized and that logical, structural, mechanical, electrical, and chemical changes may be made without departing from the scope of the invention. To avoid detail not necessary to enable those skilled in the art to practice the embodiments described herein, the description may omit certain information known to those skilled in the art. The detailed description is, therefore, not to be taken in a limiting sense, and the scope of the illustrative embodiments is defined only by the appended claims.

In the drawings and description that are included, the drawing figures are not necessarily to scale. Certain features of the invention may be exaggerated in scale or in somewhat schematic form and some details of conventional elements may not be shown in the interest of clarity and conciseness.

The previous detailed description is of a small number of embodiments for implementing the invention and is not intended to be limiting in scope. The following claims set forth a number of the embodiments of the invention disclosed with greater particularity.

What is claimed:

1. A magnetic field sensor, comprising:
   three strain gauges, wherein each strain gauge is orthogonally positioned to the other strain gauges, and each strain gauge comprises a vibrating component;
   a coil positioned to produce a bias field to enhance sensitivity of the strain gauges;
   one or more magnetostrictive layers disposed upon each of the vibrating components of the strain gauges, wherein the magnetostrictive layers are configured to cause a displacement of the strain gauge in response to sensing a magnetic field;
   a processor connected to the strain gauges and configured to determine one or more parameters of the magnetic field in response to sensing the magnetic field by measuring a resonance frequency of the vibrating components and a difference between the resonance frequencies of each pair of the strain gauges.

2. The magnetic field sensor according to claim 1, further comprising a memory configured to store readings from the strain gauge.

3. The magnetic field sensor according to claim 1, wherein each strain gauge includes a quartz crystal.

4. The magnetic field sensor according to claim 1, wherein the magnetostrictive layers are formed from Terfenol-D.

5. The magnetic field sensor according to claim 1, wherein the one or more parameters include at least an amplitude and an orientation of the magnetic field.

6. The magnetic field sensor according to claim 1, wherein the one or more magnetostrictive layers are deposited on each strain gauge utilizing chemical vapor deposition.

7. The magnetic field sensor according to claim 1, wherein the one or more parameters include an amplitude and an orientation of one or more magnetic fields including the magnetic field and are communicated to a remote device.

8. The magnetic field sensor according to claim 1, wherein each strain gauge includes a plurality of gauge layers interlayered with the one or more layers of magnetostrictive layers.

9. The magnetic field sensor according to claim 1, wherein the magnetic field sensor is integrated in a down hole tool for natural resource exploration.

10. The magnetic field sensor of claim 1, comprising a Helmholtz coil configured to generate the bias field.

\* \* \* \* \*